United States Patent [19]

Janssen

[11] Patent Number: 5,081,605
[45] Date of Patent: Jan. 14, 1992

[54] DIGITAL FILTER

[75] Inventor: Daniël J. G. Janssen, Eindhoven, Netherlands

[73] Assignee: U.S. Philips Corp., New York, N.Y.

[21] Appl. No.: 401,574

[22] Filed: Aug. 28, 1989

Related U.S. Application Data

[63] Continuation of Ser. No. 6,299, Jan. 16, 1987, abandoned, which is a continuation of Ser. No. 851,869, Apr. 11, 1986, abandoned, which is a continuation of Ser. No. 529,894, Sep. 7, 1983, abandoned.

[30] Foreign Application Priority Data

Sep. 10, 1982 [NL] Netherlands .................. 8203520

[51] Int. Cl.$^5$ ............................................. G06F 15/31
[52] U.S. Cl. ............................................. 364/724.16
[58] Field of Search .................. 364/724.16, 724.01

[56] References Cited

U.S. PATENT DOCUMENTS

| | | | |
|---|---|---|---|
| 3,965,338 | 6/1976 | van Gerwen et al. | 364/724 |
| 3,988,606 | 10/1976 | Eggermont | 364/724 |
| 4,031,378 | 6/1977 | Le Comte | 364/724 |
| 4,086,474 | 4/1978 | Negi et al. | 364/724 |
| 4,104,729 | 8/1978 | Gingell | 364/724 |
| 4,121,296 | 10/1978 | Snyders et al. | 364/724 |
| 4,125,866 | 11/1978 | van Essen et al. | 364/724 |
| 4,231,100 | 10/1980 | Eggermont | 364/724 |
| 4,349,889 | 9/1982 | van den Elzen et al. | 364/724 |
| 4,691,293 | 9/1987 | Conboy | 364/724 |

Primary Examiner—Dale M. Shaw
Attorney, Agent, or Firm—Jack D. Slobod

[57] ABSTRACT

Digital filter arrangement in which a sample of an output signal is calculated by forming the sum of the products of a set of samples of an input signal and a set of filter coefficients. To provide a more accurate encoding of the filter coefficients without great consequences for the hardware, the filter coefficients are encoded by combinations of the form:

$$K1 \cdot 2^m + K2 \cdot 2^n,$$

wherein n and m are integers and it holds that for at least one coefficient: $1 < |K1| < 2$ and $|K2| = 0$ or 1 or: $1 < |K1| < 2$ and $1 < |K2| < 2$ and a multiplier is present for combinatorially multiplying a signal sample by the factor $|K1|, |K2|$ which is located between 1 and 2.

9 Claims, 2 Drawing Sheets

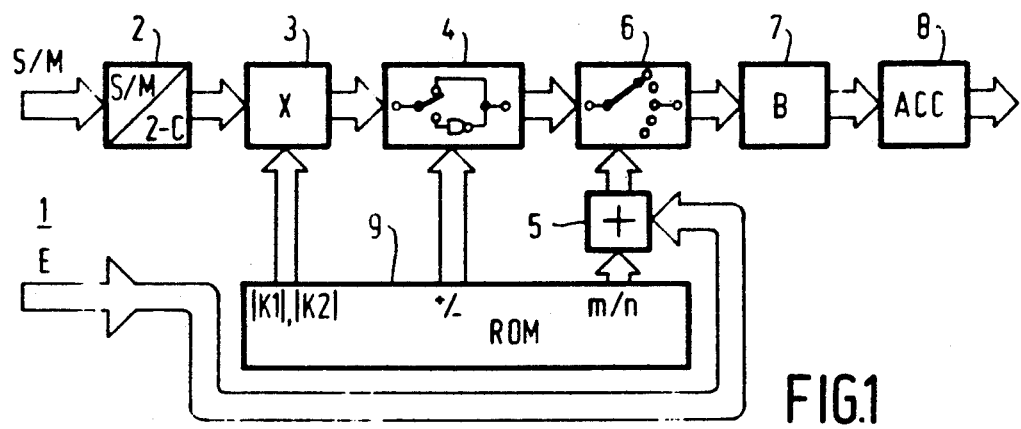
FIG.1
| 32 | 42 | 80 | 116 | 136 | 140 | 124 | 88 | 32 | -12 | -48 | -60 |
| -48 | 20 | 10 | 36 | 38 | 32 | 6 | -12 | -28 | -24 | -16 | 4 |
| 16 | 22 | 16 | 6 | -10 | -16 | -12 | -4 | 2 | 12 | 12 | 6 |
| 0 | -4 | -8 | -4 | -2 | 3 | 6 | 4 | 4 | -3 | 2 | -8 |
FIG.2
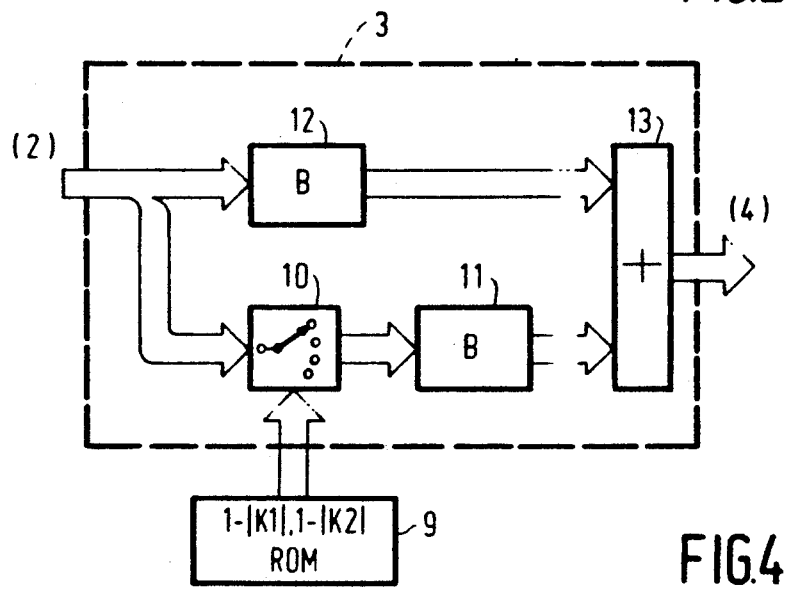
FIG.4

DIGITAL FILTER

This is a continuation of application Ser. No. 6,299, filed Jan. 16, 1987 which is a continuation of Ser. No. 851,869, filed Apr. 11, 1986 which is a continuation of Ser. No. 529,894, filed Sept. 7, 1983, all now abandoned.

BACKGROUND OF THE INVENTION

(1) Field of the Invention

The invention relates to a digital filter having a finite impulse response, comprising means for receiving applied digitally encoded signal samples of an input signal, means for storing filter coefficients, means for forming products of received signal samples and stored filter coefficients and means for forming a sum of a plurality of said products for producing an encoded signal sample of an output signal.

(2) Description of the Prior Art

For each output sample of a digital filter of the type having a finite impulse response (FIR-filter), a sum of products of filter coefficients and input samples must be calculated.

When only a small number of clock instants are available for calculating the output sample and in addition little material (hardware) is available, it will be difficult to satisfy high filter requirements.

It is already known from U.S. Pat. No. 3,965,338 to use a bit position shifting arrangement instead of a multiplier in order to reduce the required hardware. It is further known from U.S. Pat. No. 3,988,606 to encode the filter coefficients as a combination of the lowest possible number of powers of the base number 2, as a result of which the number of required clock instants for calculating an output sample is reduced.

Employing the principles of these patent specifications, it is, for example, possible to calculate in 62 clock pulses an output sample of a filter having 40 filter coefficients (40-point filter) by the choice that 18 coefficients are a power of the base number 2 and 22 coefficients are a combination of two powers of the base number 2. In practice, it may be found that this encoding operation of the filter coefficients is too coarse to realize the filter requirements imposed.

SUMMARY OF THE INVENTION

The invention has for its object to provide a digital filter of the above-described type, which, for a given number of clock pulses available for the calculation of a signal sample and only a slight increase of the hardware, allows a more accurate encoding of the filter coefficients, so that more severe filter requirements can be satisfied.

According to the invention, the digital filter coefficients are formed by combinations of the form:

$$K1 \cdot 2^m + K2 \cdot 2^n$$

wherein n and m are integers and the factors K1 and K2 are positive or negative numbers, and that it holds for at least one coefficient that:

$$1 < |K1| < 2 \text{ and } K2 = 0 \text{ or } 1 \text{ or: } 1 < |K1| < 2 \text{ and } 1 < |K2| < 2,$$

the means for forming the products comprising means for multiplying in a combinatorial manner a received signal sample by the factor $|K1|, |K2|$ which is located between 1 and 2.

BRIEF DESCRIPTION OF THE FIGURES

FIG. 1 shows the block circuit diagram of a digital filter according to the invention;

FIG. 2 is a Table showing the values of the samples of an impulse response which are encoded in accordance with the invention;

FIG. 4 shows the block circuit diagram of an alternative combinatorial circuit for multiplying a signal sample by a factor 1.5, 1.25 or 1.125.

DESCRIPTION OF THE EMBODIMENT

Figure 3:
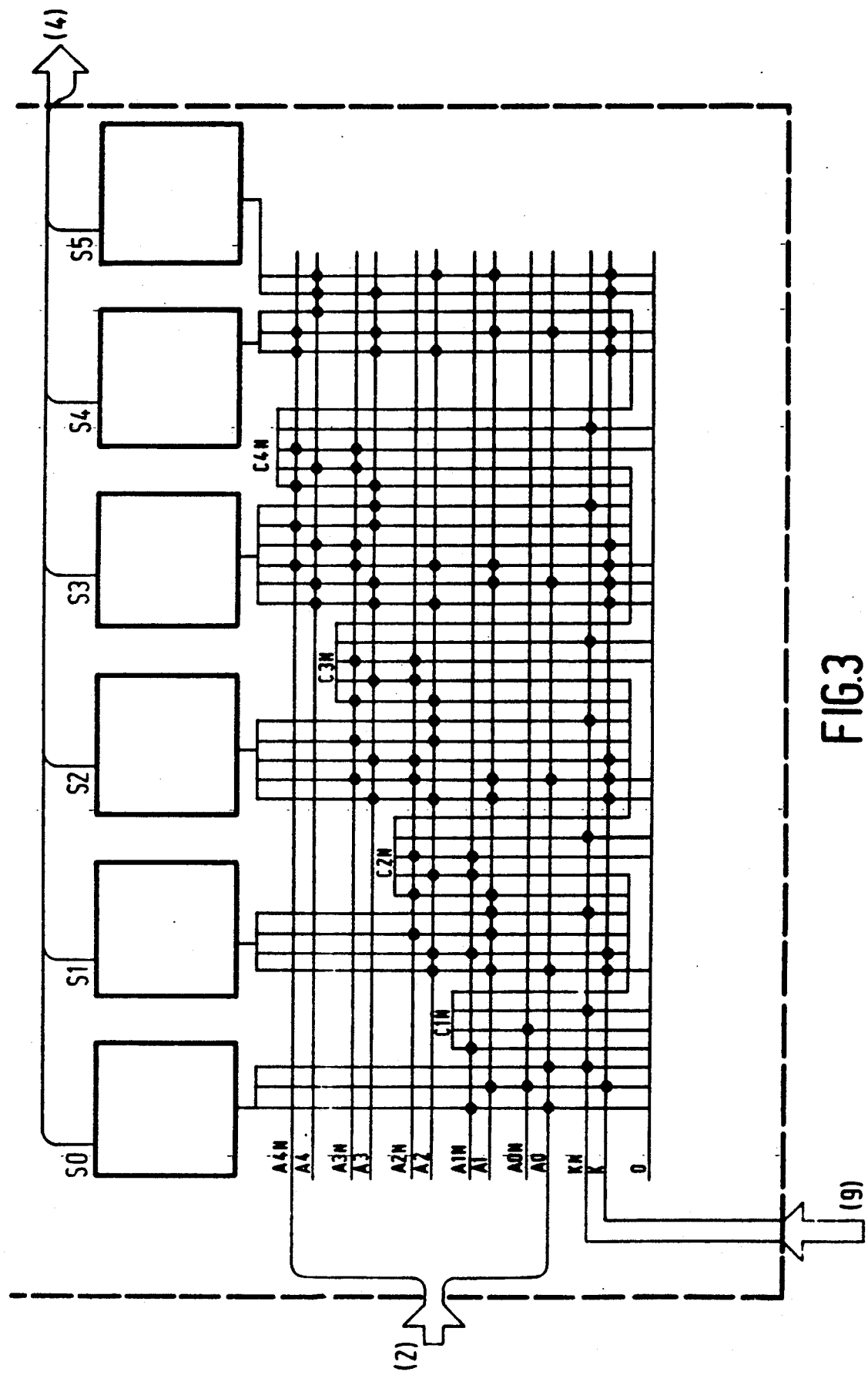
FIG. 3 shows an example of a combinatorial circuit for multiplying a number by the factor of 1.5, for use in the filter shown in FIG. 1.

A block circuit diagram of a digital filter in which the invention is employed, is shown in FIG. 1.

The invention relates here, by way of example, to an interpolating digital filter having a finite impulse response (FIR-filter), having an 8 kHz input sampling frequency, an interpolation factor of 4, an output sampling frequency of 32 kHz, an internal clock frequency of 512 kHz and an impulse response which can be characterized by 48 coefficients (48-point filter).

Samples of an analog input signal are applied in numerical notation with sign-magnitude (S/M) and exponent (E) to the input 1. The notation S/M is converted in block 2 into the 2's-complement notation (2-C). Thereafter, the sample is multiplied by the modulus of the factors K1 and K2, respectively, in block 3, and thereafter multiplication by the sign ± of the factors K1 and K2, respectively, is effected in block 4.

The exponent E of the sample is combined with the exponents m and n, respectively, which are associated with the factors K1 and K2, respectively, in block 5. The results m+E and n+E, respectively, shift the output number of block 4 a corresponding number of bit positions in block 6, to realize a multiplication of the output number by the base number 2 raised to the power m+E and n+E, respectively.

The output number of block 6 is buffered in block 7 and thereafter accumulated in block 8.

The coefficients of the filter are encoded in accordance with the formula:

$$\text{coefficient} = K1 \cdot 2^m + K2 \cdot 2^n$$

The coefficients are stored in a ROM memory 9.

According to the system described in the above-mentioned U.S. Pat. No. 3,988,606, it holds for the coefficients that:

$$|K1| = 1, |K2| = 1 \text{ or } |K1| = 1, K2 = 0.$$

In that case the multiplier 3 is not required.

In accordance with the invention, so as to increase the accuracy, at least one of the coefficients is encoded such that:

$$1 < |K1| < 2 \text{ and } |K2| = 0 \text{ or } 1, \text{ or}$$

$$1 < |K1| < 2 \text{ and } 1 < |K2| < 2.$$

The Table of FIG. 2 shows the coefficient values of a 48-point filter to which the above applies. For 33 coefficients K2=0 and 15 coefficients have been encoded as a combination of two powers of the base number 2

($K1 \neq 0$, $K2 \neq 0$). The number of multiplications in block 3 in an input sampling period is $32 + 2 \cdot 16 = 64$. According to the invention, the multiplier 3 is in the form of a combinatorial circuit for multiplying, on command, the output number of block 2 by $|K1|$, and $|K2|$, respectively, or to leave the output number unaltered. For simplicity it is ensured that for all coefficients for which $1 < |K1|$, $|K2| < 2$, the absolute values of the factors K1 and K2 are the same for all the coefficients.

An example of a combinatorial circuit for multiplying an input number by the factor 1.5 is shown in FIG. 3.

The input number is a number having four bits A0, A1, A2, A3, which bits together with their negations A0N, A1N, A2N, A3N are applied. The command is represented by the bit K and its negation KN, wherein $K = 1$ signifies the command: multiply by the factor 1.5. A dot (·) indicates a logic AND-operation. A horizontal wire connection between two or more vertical lines effects a logic OR-operation, as at the inputs of the buffer stages S0, . . . S5. The transfers between the stages are indicated by the negations C1N . . . C4N.

When $K = 1$, then an addition is effected between the number (A0, A1, A2, A3) and the same number (A1, A2, A3, 0) shifted over one bit position, which shift corresponds to a multiplication by a factor of $\frac{1}{2}$, so that the total operation corresponds to the multiplication by the factor of $1 + \frac{1}{2} = 1.5$. Further factors for which the multiplication can be realized in the same simple way are, for example, the factors 1.25 and 1.25.

An alternative construction of multiplier 3 is shown in FIG. 4. Here the ROM memory 9 supplies the values $1 - |K1|$, $1 - |K2|$ which are either 1 or a negative power of the base number 2, such as for example $\frac{1}{2}$, $\frac{1}{4}$ or $\frac{1}{8}$. In the latter case the output number of block 2 is shifted in block 10 over a corresponding number of bit positions and thereafter buffered in block 11. The output number of block 2 is buffered without change in block 12 and is thereafter added to the number from buffer 11 in block 13. Shifting the output number of block 2 over one, two or three bit positions in the direction of the least significant bit (LSB) corresponds to a multiplication by the factor of $\frac{1}{2}$, $\frac{1}{4}$ or $\frac{1}{8}$, so that the total operation described above corresponds to the multiplication by the factor of 1.5, 1.25 or 1.125.

It will be obvious, that the alternative embodiment shown in FIG. 4 renders it possible in a simple way to operate with absolute values of the factors K1 and K2 for the filter coefficients for which $1 < |K1|$, $|K2| < 2$, which are selected from a set of values such as 1.5, 1.25, 1.125.

What is claimed is:

1. A digital filter having a finite impulse response, comprising means for receiving applied digitally encoded signal samples of an input signal, means for storing filter coefficients, means for forming products of received signal samples and stored filter coefficients and means for forming a sum of a plurality of said products for producing an encoded signal sample of an output signal, characterized in that the filter coefficients are formed by combinations of the form:

$$K1 \cdot 2^m + K2 \cdot 2^n$$

wherein n and m are integers and the factors K1 and K2 are positive or negative numbers and that it holds for at least one coefficient that:

$m \geq 0$ and $1 < |K1| < 2$ and $K2 = 0$ or $1 \leq |K2| < 2$ and the means for forming the products comprises means for multiplying in a combinatorial manner the sign-magnitude of a received signal sample by the whole and fractional parts of the numbers $|K1|, |K2|$, means for multiplying these combinatorial products by the signs of the factors K1 and K2, and means for combining the exponents of the signal samples with the exponents m and n and for shifting the product of said sign multiplication to effect multiplication by said combined exponents.

2. The digital filter as claimed in claim 1, wherein the means for combinatorially multiplying a signal sample by the numbers $|K1|$ and $|K2|$ (when between 1 1 and 2) comprises a bit position shift arrangement for shifting an applied number over a number of bit positions and means for adding the shifted number to the applied number.

3. The filter of claim 1, wherein the means for combinatorially multiplying comprises at least one gate array for multiplying the sign-magnitude by a predetermined rational number which is the sum of one and a negative power of two.

4. The digital filter of claim 3 wherein:
said memory comprises a READ ONLY memory; and
said means for shifting receives as shift commands the quantities $1 - |K_1|$ and $1 - |K_2|$ from said READ ONLY memory.

5. The digital filter of claim 1, where for said at least one coefficient: $K2 \neq 0$ and $n \geq 0$.

6. The digital filter of claim 1, where for said at least one coefficient, the fractional parts of $|K_1|$, and $|K_2|$, if non-zero, are negative powers of two.

7. A digital filter having a finite impulse response for filtering a plurality of signal samples identified by an exponent E and a numerical notation of sign-magnitude (S/M) comprising:
a) a memory for storing components of a plurality of filter coefficients, said components being for forming said coefficients using operations of the form $K_1 \cdot 2^m + K_2 \cdot 2^n$, where the components n and m are integers and $K_1$, $K_2$ are positive or negative numbers, at least one of said coefficients being defined as $m \geq 0$ and $1 < |K_1| < 2$ and $K2 = 0$ or $1 \leq |K_2| < 2$ b) a multiplier for effecting said operations, connected to receive input signal samples numerical notation, and connected to receive said components of said filter coefficients, said multiplier comprising:
i) a bit position shifter, receiving said signal samples numerical notation, for shifting the radix point of said signal samples over a number of bit positions determined by the fractional part of the absolute value of said numbers $K_1$ and $K_2$;
ii) means for combining said shifted samples with unshifted samples thus producing signal samples multiplied by a whole and a fractional number of absolute value between 1 and 2,
iii) a sign multiplier for multiplying said multiplied signal samples by a sign factor; and
iv) means for multiplying an output signal from said sign multiplier by $2^{n+E}$ and $2^{m+E}$.

8. The digital filter of claim 7, wherein said bit position shifter and means for combining shifted samples is such that said fractional number is a negative power of two.

9. The digital filter of claim 7, where for said at least one coefficient: $K2 \neq 0$ and $n \geq 0$.

* * * * *